United States Patent [19]
Hazama et al.

[11] 4,296,391
[45] Oct. 20, 1981

[54] SURFACE-ACOUSTIC-WAVE FILTER FOR CHANNEL SELECTION SYSTEM OF TELEVISION RECEIVER

[75] Inventors: Katashi Hazama, Zushi; Akitsuna Yuhara, Yokohama, both of Japan

[73] Assignee: Hitachi, Ltd., Tokyo, Japan

[21] Appl. No.: 954,124

[22] Filed: Oct. 24, 1978

[30] Foreign Application Priority Data

Oct. 28, 1977 [JP] Japan ............................. 52-128699
Oct. 28, 1977 [JP] Japan ............................. 52-128700

[51] Int. Cl.³ .......................... H03H 9/64; H03H 9/68
[52] U.S. Cl. ................................. 333/193; 333/150; 333/196; 455/179
[58] Field of Search ............................ 333/150–155, 333/193–196; 358/188, 191, 193–195, 904, 191.1, 195.1, 196; 325/452, 453, 462, 477, 490, 416, 417, 419–423, 445, 457; 310/313, 313 R, 313 B, 313 C; 331/107 A, 1 R; 455/179–180

[56] References Cited

U.S. PATENT DOCUMENTS

| 3,755,761 | 8/1973 | Hartmann ...................... 310/313 C |
| 3,831,116 | 8/1974 | Davis, Jr. et al. .......... 331/107 A X |
| 3,858,118 | 12/1974 | Daniel ............................ 333/193 X |
| 4,054,841 | 10/1977 | Henaff et al. ................... 333/150 X |
| 4,115,744 | 9/1978 | Lewis ............................. 331/107 A |

FOREIGN PATENT DOCUMENTS

| 2453723 | 5/1975 | Fed. Rep. of Germany . |
| 2609883 | 9/1976 | Fed. Rep. of Germany . |
| 2235233 | 7/1977 | Fed. Rep. of Germany . |
| 2312881 | 12/1976 | France ............................... 333/150 |

OTHER PUBLICATIONS

Adkins–"Fast Frequency Hopping with Surface Acoustic Wave (SAW) Frequency Synthesizers," Conference: Proceedings of The 30th Annual Symposium in Frequency Control, Atlantic City, N.J., U.S.A., 2–4 Jun. 1976, pp. 367–370.
Japanese Laid–Open Patent Application No. 49-8150, laid open Jan. 24, 1974, 4 pages.
Japanese Laid–Open Patent Application No. 49-8151, laid open Jan. 24, 1974, 3 pp.

Primary Examiner—Marvin L. Nussbaum
Attorney, Agent, or Firm—Craig and Antonelli

[57] ABSTRACT

A surface-acoustic-wave filter for a channel selection tuning system of a television receiver includes at least two comb filter elements, each of which comprises an input transducer provided on a piezoelectric substrate and adapted to convert an input electrical signal into an elastic surface wave, and first and second output transducers disposed on the substrate for receiving the elastic surface wave propagating in the same direction from the input transducer. The first and second output transducers are positioned from the input transducer with different distances. The transducers of the two comb filter elements are so designed that the respective comb filter elements respond to frequencies of different program channel bands over for example VHF and UHF bands. The distances of the first and the second output transducers from the input transducer in the wave propagating direction are so predetermined that reciprocal of the difference in delay time between the electrical signals derived from the first and second output transducers is equal to a divisor of an interchannel frequency difference in the corresponding channel band.

12 Claims, 12 Drawing Figures

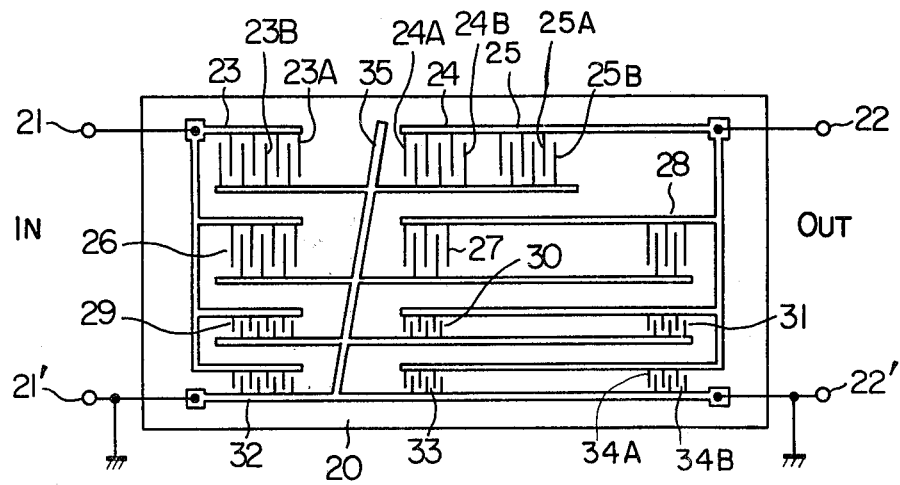
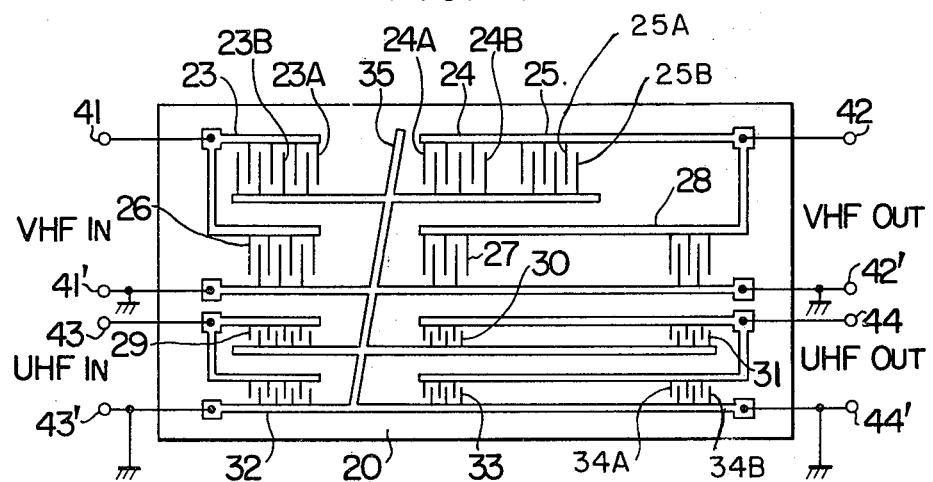
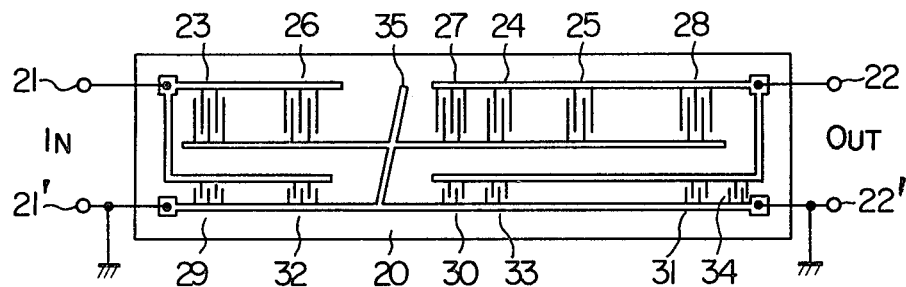

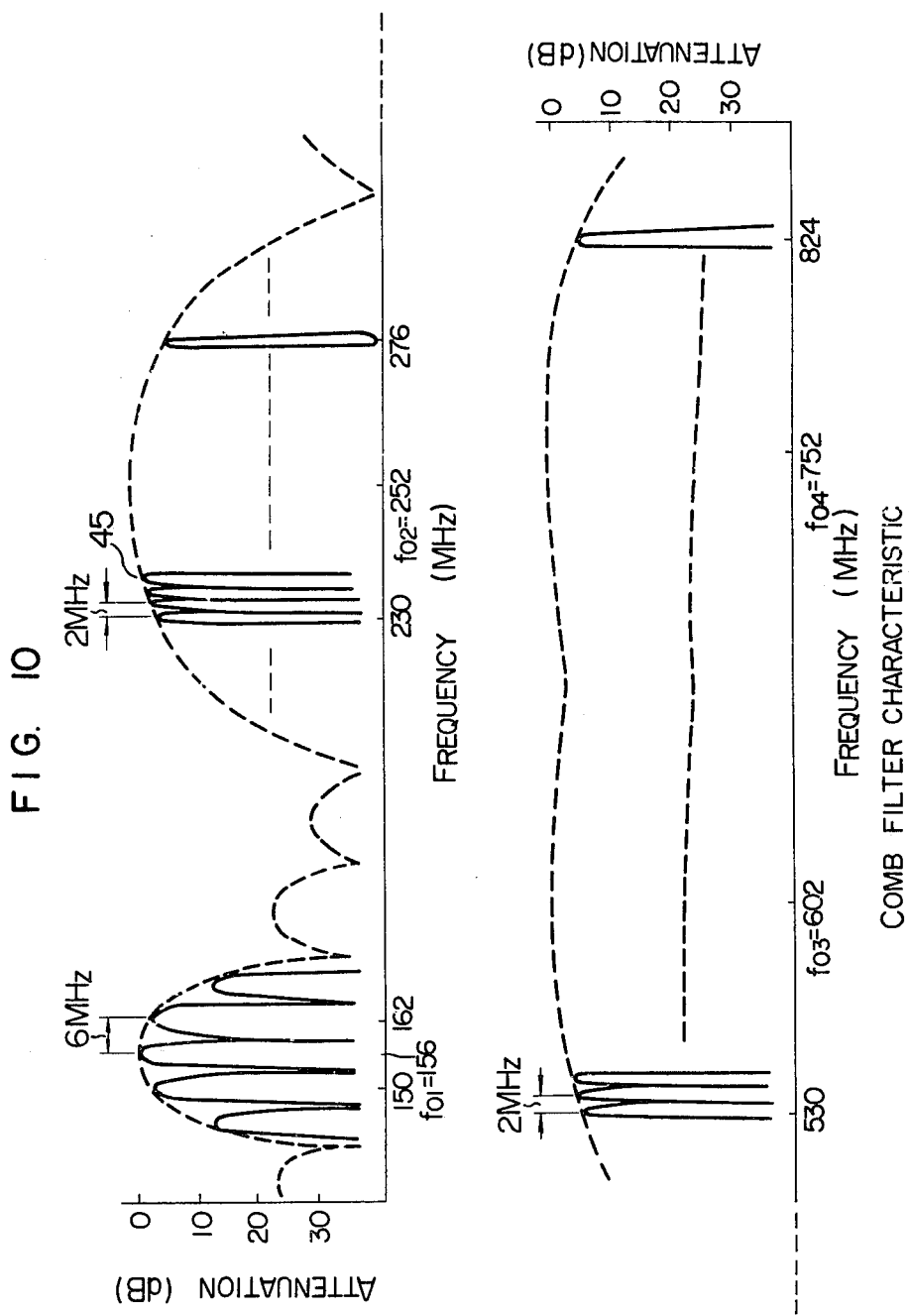

SURFACE-ACOUSTIC-WAVE FILTER FOR CHANNEL SELECTION SYSTEM OF TELEVISION RECEIVER

The present invention relates to a surface-acoustic-wave filter used for an automatic channel selection or tuning system of television receivers and/or radio receivers. In particular, the present invention relates to an improvement or novel arrangement of a surface-acoustic-wave comb filter which is particularly suited for use with an electronic tuner and for other multi-channel selecting applications.

In the automatic channel selection system of a television receiver, it known to perform detection by means of a comb filter which exhibits the comb characteristic of a predetermined frequency interval corresponding to an inter-channel frequency interval.

A comb filter is defined as a filter whose insertion loss forms a sequence of narrow pass bands or narrow stop bands centered at multiples of some specified frequency. See IEEE Standard Dictionary of Electrical and Electronic Terms, Second Edition, page 256.

An automatic channel selecting system in which such comb filter is constituted by an elastic surface wave filter is proposed in a copending U.S. application Ser. No. 936,923, now U.S. Pat. No. 4,232,397, filed in the name of Murata et al on Aug. 25, 1978 on the basis of Japanese patent application No. 52-101750 filed on Aug. 26, 1977 and assigned to the same assignee as the present application. In order to have a better understanding of the invention, description will be first made of the outline of the automatic channel selecting system of the copending application by referring to FIG. 1 of the accompanying drawings. As can be seen from this figure, an electronic tuner 1 includes a voltage-controlled local oscillator 2 whose oscillation frequency is controlled in dependence on a control voltage applied thereto. The output frequency from the local oscillator 2 is supplied to an elastic surface wave filter element 3 exhibiting the comb filter characteristic described above, in which two signals having a phase difference relative to each other are detected and synthesized. An output signal from the comb filter 3 is applied to an envelope detector 4, the output from which is amplified by an amplifier 5 and supplied to a programmable counter 6. The programmable counter 6 is adapted to count the number of peaks in the output signal from the amplifier 5 and may be constituted by an up-down counter having a presettable function. A channel number input unit 7 is provided for setting a program channel to be received. The channel number input to the unit 7 is encoded by an encoder 8, the encoded output of which is preset in the programmable counter 6. Provided additionally is a voltage sweeping circuit 9 for supplying a sweep control voltage to the local oscillator 2 to thereby progressively increase or decrease the oscillation frequency thereof relative to a reference frequency. The programmable counter 6 counts variation in frequency of the detector output signal which varies periodically every time when the oscillation frequency of the local oscillator 2 undergoes a change of a predetermined magnitude which is in inverse proportion to the phase difference described above. When the count of the counter 2 has reached the preset value, the operation of the voltage sweeping circuit 9 is stopped by the output from the counter 6, whereupon the automatically tuned state is established. In this manner, in the automatic channel selector system, the number of intersections of the swepted local oscillation frequency signal with predetermined frequencies allotted to individual program channels is counted, whereby the sweeping operation is stopped at the local oscillation frequency attained at a predetermined number of the counts corresponding to a desired channel.

When the comb filter 3 of such an automatic channel selector is constituted by LC-filters including coils and capacitors, an increased number of parts are disadvantageously required. In addition, circuit arrangement which is undesirably complicated, involving numerous troublesome adjustments.

In the case of the copending application recited above, a surface-acoustic-wave filter having a fundamental structure such as shown in FIG. 2 is used in place of an LC filter. See particularly FIGS. 1, 3 and 5 of that copending application. A typical example of such comb filter making use of the surface acoustic wave is disclosed in Japanese Laid-Open patent application Nos. 49-8150 and 49-8151 of Ikeuchi et al laid open on Jan. 24, 1974. Such surface acoustic wave comb filter will be outlined by referring to FIG. 2. The prior art filter comprises an input transducer 12 and first and second output transducers 14 and 15 arrayed substantially linearly on the same plane of a piezoelectric substrate 13 with different spaces therebetween. The comb filter shown in FIG. 2 further includes a signal source 11 connnected to the interposed input transducer 12 and mixer circuits 16 and 16' for mixing the output signals from the first and second output transducers 14 and 15 located in opposition to each other relative to the interposed input transducer 12. With a view to preventing the input signal from being electrically directly coupled to the output signals, shield electrodes 18 and 18' will be required for providing isolation between the input transducer 12 and the output transducers 14 and 15, respectively.

In operation, the electrical signal from the signal sourse 11 is converted by the input transducer 12 into a surface acoustic wave. The surface acoustic wave propagates on and along the piezoelectric substrate 13 to both the left and the right as viewed in FIG. 2 and is converted again into electric signals by the output transducers 14 and 15. The output signals from the transducers 14 and 15 connected in parallel to each other through the mixer lines 16 and 16' are added together and supplied to a load 17.

When the propagation times for the surface acoustic waves to reach the output transducers 14 and 15 from the input transducer 12 are represented by $\tau_1$ and $\tau_2$, a pitch $\Delta f$ of the frequency interval of the synthesized output signal may be given by the following expression:

$$\Delta f = (1/|\tau_1 - \tau_2|)$$

In other words, the frequency characteristic of the filter shown in FIG. 2 is a comb filter characteristic in which peaks and bottoms make appearance for every frequency pitch $\Delta f$, as the definition is explained above. The same effect is attained even when the signal source 11 and the load 17 are interchanged at the input/output terminals of the filter.

The comb filter utilizing the surface acoustic wave of the prior art encounters difficulties described below.

Because of the arrangement in which the output transducers 14 and 15 are positioned on opposite sides of the input transducers, the conductors or lead wires for connecting the signal source 11 to the input transducer 12 are necessarily intersected by the lead conductors 16 and 16' interconnecting the output transducers 14 and 15 for deriving the synthesized output signal. As a result, direct electrical coupling will be likely to occur between the input and the output sides, to thereby involve shallowed bottom portions in the peak-to-bottom profile of the comb filter characteristic curve.

Referring again to FIG. 2, when the distance between the input transducer 12 and one output transducer 14 is represented by a, while the distance between the input transducer 12 and the other output transducer is represented by $a+b$, then $b=v\cdot|\tau_1-\tau_2|$, where v is sound velocity of the surface acoustic wave which is determined by material constant of the used piezoelectric substrate. Accordingly, the maximum dimension of the filter between the output transducers is equal to $2a+b$. In this connection, it should be mentioned that the size of the piezoelectric substrate, namely the size of piezoelectric material chip is preferably to be as small as possible from the viewpoint of production costs and mass production. However, in the case of the filter arrangement shown in FIG. 2, the size of the substrate chip is determined by the geometrical factor of the distance $(2a+b)$ between the output transducers, which distance is inherently insusceptible to be reduced. Thus, the prior art comb filter such as shown in FIG. 2 can not be implemented in a desired small size. This problem still remains even when one output transducer is located between two input transducers as disclosed in the above-mentioned Japanese Laid-Open patent application No. 49-8151.

Further, since the possibility of occurrence of direct coupling of the input signal will exist between the input transducer 12 and the output transducer 14 on one hand and between the transducers 12 and 15 on the other hand, it is necessary to provide two separate shield electrodes 18 and 18' for isolating safely the two signals from each other. However, provision of the shield electrodes on the propagation paths of the elastic surface wave will involve variation in the propagation time in dependence on the width and thickness of the electrodes located on the wave propagation path, incurring also an increased delay time.

When a television receiver incorporating the surface-acoustic-wave element described above as disclosed in the above-referenced copending application is adapted to the broadcasting standard in Japan for example, the local oscillation frequency range of the receiver has to be from 150 MHz to 825 MHz, since the television broadcasting frequency range is correspondingly wide to cover the frequency bands of VHF and UHF. Accordingly, the fractional bandwidth required for the comb filter 3 is about 140% relative to the center frequency of 487 MHz. In contrast, the fractional bandwidth of the single elastic surface wave filter is usually only in the order of 50%. It is thus difficult to implement a practical wide-band comb filter with the single elastic surface wave filter. In other words, a plurality of discrete filter elements basically shown in FIG. 2 are required in a suitable combination in order to obtain a comb filter having a wide frequency band. However, such combination will in turn require an increased number of parts and complicated interconnecting wirings with correspondingly increased number of intersections, involving high probability of direct coupling between the intput and the output signals as well as troublesome adjustment as in the use of LC filters. It must be pointed here that the above-referenced copending application neither teaches nor suggests any proposal to accomplish the wide-band characteristic in the comb filter.

Accordingly, an object of the present invention is to provide a surface-acoustic-wave filter for channel selection which can exhibit a desired comb characteristic over a wide frequency band.

Another object of the present invention is to provide a single-chip, elastic surface wave, adjustment-free, composite filter for channel selection which exhibits a desired comb filter characteristic over a wide frequency band covering VHF/UHF programs.

Still another object of the present invention is to provide a novel structure of a surface-acoustic-wave filter of a comb frequency characteristic which can be implemented in a single chip of a reduced area and in which a possible direct coupling between input and output signals can be suppressed significantly.

According to a general feature of the present invention, there is provided a surface-acoustic-wave filter for channel selection in television and/or radio receivers which comprises a plurality of elastic surface wave filter elements connected in parallel to one another on a single-chip piezoelectric substrate, each of the filter elements being geometrically formed to exhibit a comb frequency characteristic in a respective relatively narrow frequency band which constitutes a divided part of a wide frequency band to be covered by the plurality of the filter elements.

According to a preferred embodiment of the present invention, there is proposed a small-sized, surface-acoustic-wave filter exhibiting a comb frequency characteristic, in which first and second transducers are disposed in the same propagating direction of the elastic surface wave relative to a third transducer with different distances of a and $(a+b)$ from the latter, where $b=v\cdot|\tau_1-\tau_2|$, and $\Delta f=(1/|\tau_1-\tau_2|)$ as defined above, and in which the first and second transducers and the third transducer respectively are on the input side and on the output side, or vice versa.

Other objects, features and advantages of the invention will become more apparent from the following detailed description of preferred embodiments thereof taken in conjunction with the accompanying drawings in which.

Figure 1:
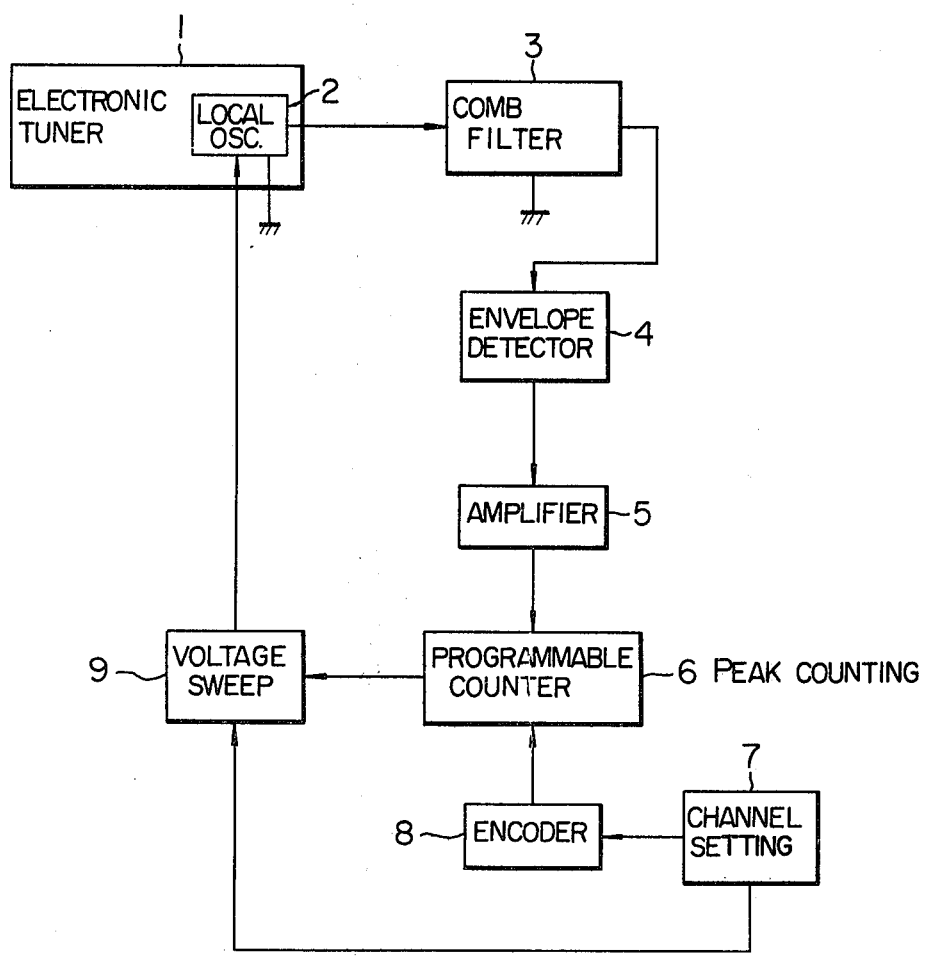
FIG. 1 is a block diagram illustrating a principle of an automatic channel or program selecting system to which the present invention can be applied.

FIGS. 9A and 9B respectively are plan views to show a surface-acoustic-wave composite filter for channel selection according to an embodiment of the present invention and a modification of FIG. 9A, FIG. 10 illustrates graphically a frequency characteristic of the filter of FIG. 9A or 9B, and FIG. 11 is a plan view of a surface-acoustic-wave filter for channel selection according to another embodiment of the present invention.

Throughout the drawings the same reference numerals are used to indicate same or similar parts or members. A number of interdigital electrodes are illustrated only schematically.

In the first place, description will be made of novel fundamental arrangements of the elastic surface wave filter according to the present invention with reference to FIGS. 3 to 9.

Figure 2:
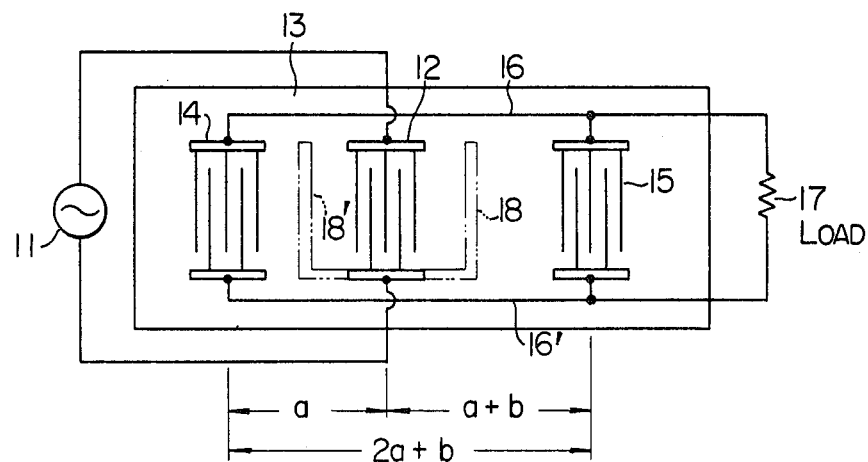
FIG. 2 is a plan view showing a hitherto known surface-acoustic-wave comb filter.
Figure 3:
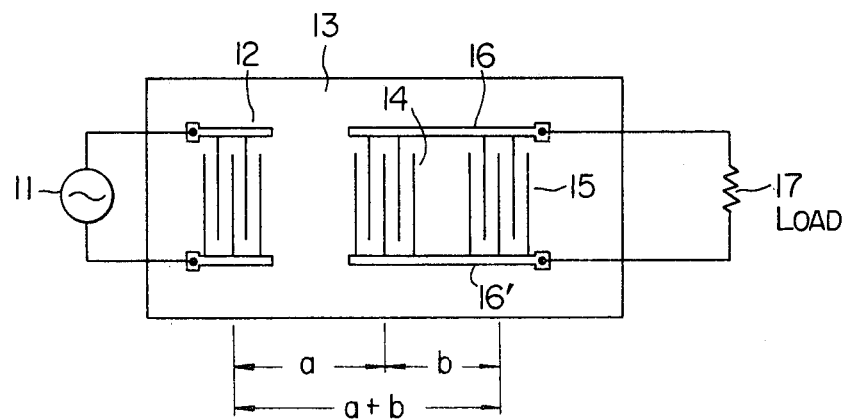
FIG. 3 is a plan view showing a fundamental arrangement of a surface-acoustic-wave comb filter according to the present invention.
Figure 5:
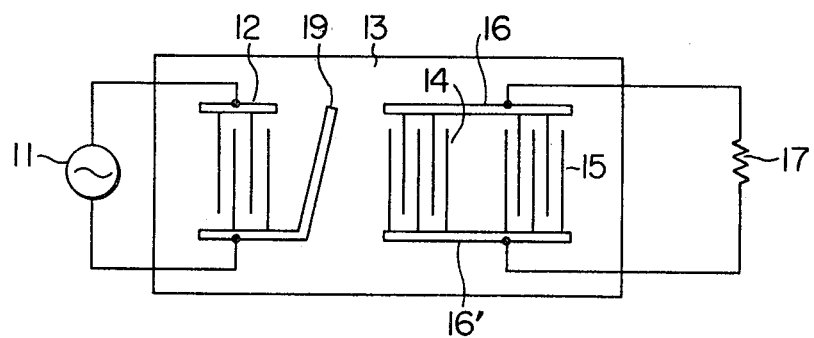
FIGS. 5 to 8 are plan views showing modifications of the comb filter arrangement shown in FIG. 3.

FIG. 3 shows a single surface-acoustic-wave filter implemented on a single piezoelectric substrate on the basis of the principle of the comb filter described hereinbefore in conjunction with FIG. 2. There are disposed on a piezo-electric substrate 13 an input transducer 12 including a plurality of interdigital electrodes for converting electric signals from a signal source 11 into corresponding elastic surface waves, and first and second output transducers 14 and 15 positioned adjacent to each other and each including a plurality of interdigital electrodes for receiving the surface acoustic wave produced from the input transducer 12 and converting it into electric signals. It will be noted that the first and second output transducers 14 and 15 are positioned in the same propagating path of the surface acoustic wave relative to the input transducer 12 with different distances of a and a+b, respectively, from the latter. In FIG. 3, the output transducer 14 is located between the input transducer 12 and the second transducer 15 on the piezoelectric chip 13. The interdigital electrodes of the first and second output transducers 14 and 15 are connected to a pair of common bus bar conductors 16, 16'. In other words, the common bus bar conductors 16, 16' serve to connect the output transducers 14 and 15 in parallel with each other and add together the output electrical signals from these transducers. The mixed or synthesized signal is supplied to a load 17 through a bonding pad for leading out a signal provided at one end of each common output bus bar. As can be seen from the figure, a pair of bus bar conductors for connecting the interdigital electrodes of the input transducer 12 have at respective ends thereof bonding pads for connecting conductors leading from the signal source 11. By virtue of the arrangement such that the output transducers 14 and 15 are disposed at the same side of the input transducer 12, the input lead-in conductors avoid intersection or crossing with the output lead-out conductors. As a result, direct electrical coupling between the input and output signals can be significantly reduced. In the case where the signal source 11 has a high frequency and/or dielectric constant of the piezoelectric substrate is high, shielding action has to be imparted to the surface of the substrate between the input and the output transducers. FIG. 5 shows a filter in which a shield electrode 19 is provided between the input transducer 12 and the one output transducer 14.

It should be recalled that the maximum distance between the output transducers of the hitherto known comb filter such as shown in FIG. 2 is equal to 2a+b, In contrast thereto, the maximum distance between the outermost transducers on the substrate chip which is a measure for the overall size of the filter is equal to (a+b) in the case of the filter arrangement shown in FIG. 3. Thus, the chip size or dimension required for implementing a filter can be reduced by a dimension a according to the teachings of the present invention. By way of numerical example, in contrast to a conventional filter which requires a chip of 2 mm in width and 6 mm in length, the corresponding filter according to the present invention can be implemented on a chip of 2 mm wide and 5 mm long. In other words, the chip size of the filter according to the present invention can be reduced by 10 to 20% as compared with that of the hitherto known corresponding filter. Thus, the arrangement shown in FIG. 3 involves an advantage that the number of chips cut from a sheet of a piezo-electric wafer can be increased.

It is believed that the disposition of the two output transducers at both sides of the interposed input transducer shown in FIG. 2 is intended to increase the utility efficiency of the surface acoustic waves produced from both sides of the input transducer and to equalize the output amplitude. In this context, examination has been made of the arrangement shown in FIG. 3. It has been found that an energy level of the surface acoustic wave picked up by the output transducers 14 and 15 to be converted into the corresponding signals is in the order of 1/10 to 1/100 of the energy level of the surface acoustic wave propagating on the piezoelectric substrate 13 and hence, additional disposition of the output transducer 14 on the propagation path between the input transducer 12 and the other output transducer 15 will give rise to no problems.

Figure 4:
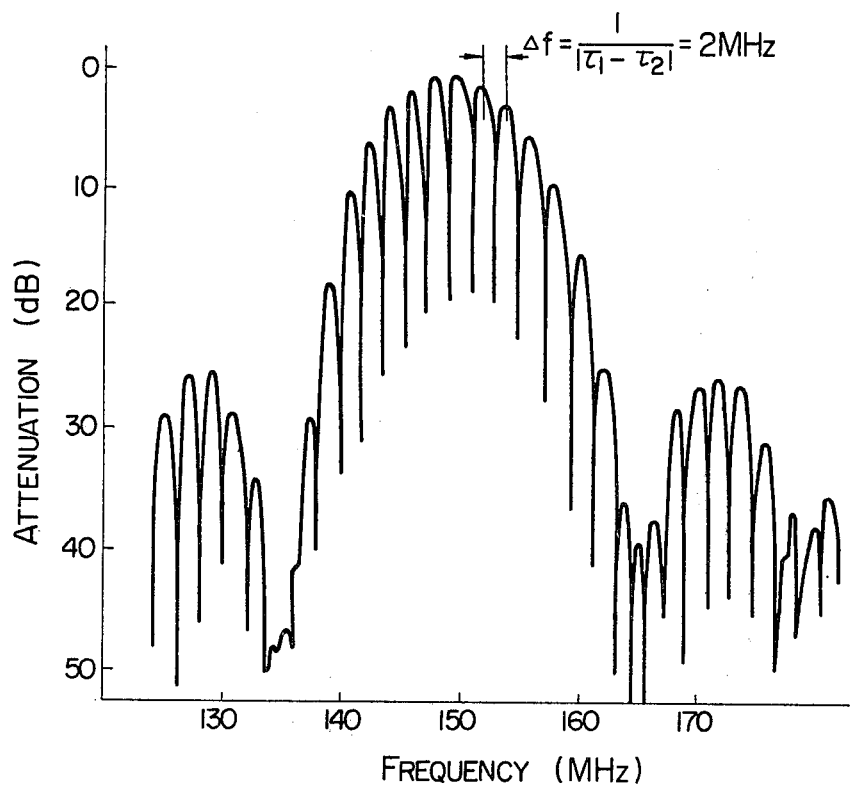
FIG. 4 is a graph to illustrate a typical frequency characteristic of a comb filter of the arrangement shown in FIG. 3.

The frequency characteristic shown in FIG. 4 has been obtained for a comb filter of the arrangement shown in FIG. 3 in which the piezoelectric substrate is formed of a single crystal of Y-cut Z propagation lithium niobate ($LiNbO_3$). Each of the transducers 12, 14 and 15 has ten pairs of interdigital electrodes with the interdigital pitch being selected equal to 11.2 $\mu$m. Distance a between the transducers 12 and 14 is equal to 1 mm, while the distance b between the adjacent transducers 14 and 15 is selected equal to 1744 $\mu$m. As can be seen from FIG. 4, a very favorable frequency characteristic has been attained with the single filter, in which the peak and the bottom make appearance for every $\Delta f = (1/|\tau_1 - \tau_2|)$ of 2 MHz in the VHF band. It is to be noted that the source 11 and the load 17 may be coupled to the transducers 14 and 15 and transducer 12, respectively.

Figure 6:
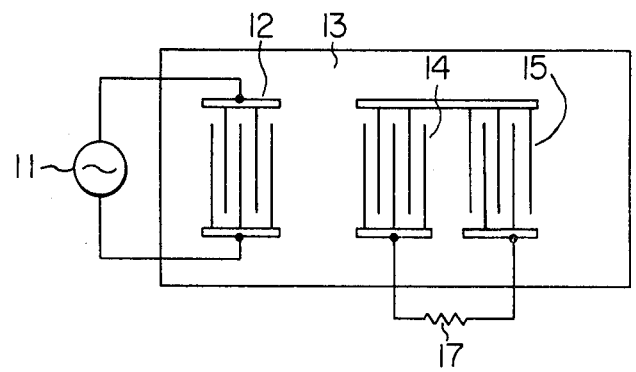
Figure 7:
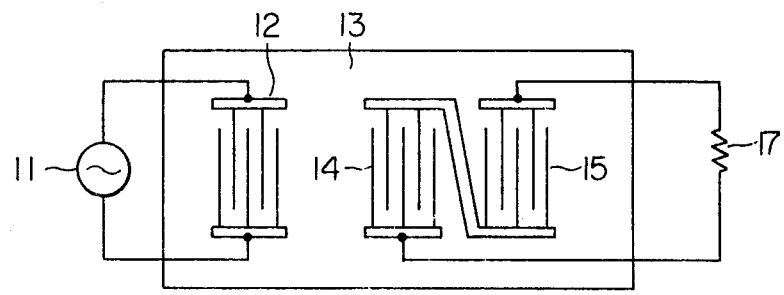

FIGS. 6 and 7 schematically show various exemplary embodiments of the invention in which the bus bars for connecting the first and the second output transducers 14 and 15 in series to each other are different as to geometrical configuration. With the series connections shown in these figures, the filters exhibit the comb frequency characteristics similar to the one attained in the filter shown in FIG. 3.

Figure 8:
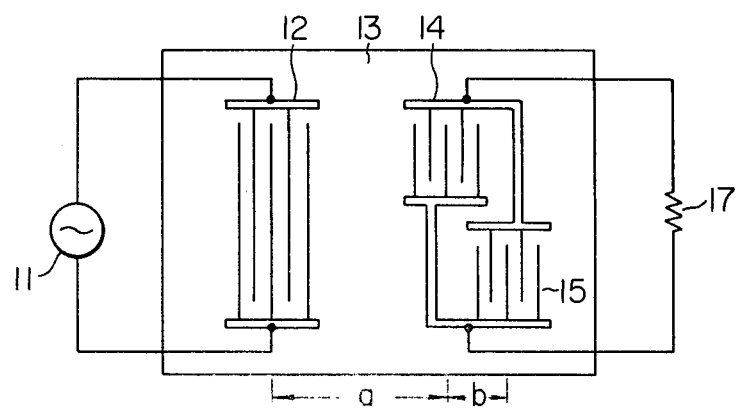

FIG. 8 shows a modification of the arrangement shown in FIG. 3 in which the propagation path for the surface acoustic wave to be received by the first output transducer 14 is offset from the propagation path of the wave received by the second output transducer 15. With this arrangement, it is possible to attain a comb characteristic varying in accordance with reciprocal of $|\tau_1 - \tau_2|$.

In the description in connection with FIG. 3 and FIGS. 5-8, it should be understood that the same filter function may be attained when the transducer 12 is coupled to the load 17 and the transducers 14 and 15 coupled to the signal source 11.

Next, embodiments of the present invention in which the novel filter arrangements described above are implemented will be described by referring to FIGS. 9 to 11.

The following table shows local oscillation frequencies of a television receivers according to the Japanese television broadcasting standard. The frequency band width covers a first channel band of low VHF bands for first-to-third program channels, a second channel band of high VHF bands for 4th-to-12th program channels and a third channel band of UHF bands for 13th-to-62th program channels.

| CHANNEL | LOCAL OSCILLATION FREQUENCY | |
|---|---|---|
| 1 | 150 | ⎫ |
| 2 | 156 | ⎬ VHF$_L$ |
| 3 | 162 | ⎭ |
| 4 | 230 | ⎫ |
| 5 | 236 | ⎪ |
| 6 | 242 | ⎪ |
| 7 | 248 | ⎪ |
| 8 | 252 | ⎬ VHF$_H$ |
| 9 | 258 | ⎪ |
| 10 | 264 | ⎪ |
| 11 | 270 | ⎪ |
| 12 | 276 | ⎭ |
| 13 | 530 | ⎫ |
| ⋮ | 6 MHz-interval | ⎬ UHF$_L$ |
| 37 | 674 | ⎭ |
| 38 | 680 | ⎫ |
| ⋮ | 6 MHz-interval | ⎬ UHF$_H$ |
| 62 | 824 | ⎭ |

FIG. 9A is a plan view showing an exemplary embodiment of the surface-acoustic-wave filter according to the invention applied for program channel selection in a television receiver of the above standard.

As can be seen from FIG. 9A, a plurality of comb filters are implemented on a single-chip of piezoelectric substrate. The single chip substrate 20 is cut from a wafer of LiNbO$_3$ in size of 6 mm×5 mm and in thickness of 0.5 mm. Electro-acoustic transducers 23 to 34 include, respectively, paired interdigital electrodes 23A–34A and 23B–34B as well as bus bar conductors integrally connected therewith which are formed of aluminum in thickness of 5000 Å on the chip substrate 20 by a vacuum evaporation process. The width of each bus bar is 100 μm. In order to form a plurality of comb filters, the transducers 23 to 34 are arranged according to the basic array as shown in FIG. 3 to produce surface acoustic wave in response to electrical input signals, while producing the electrical signal upon reception of the surface acoustic wave. Each of the transducers 23, 26, 29 and 32 serves as an input transducer to convert an electrical signal applied across the input terminals 21 and 21' into a corresponding surface acoustic (elastic surface) wave. On the other hand, the adjacent transducers in pairs (24; 25), (27; 28), (30; 31) and (33; 34) connected in parallel by common bus bar conductors serve as the output transducers for converting the elastic surface waves from the input transducers 23, 26, 29 and 32, respectively, into electric signals which are then added together through the bonding pads to appear across the output terminals 22 and 22'. Reference numeral 35 denotes a shielding electrode pattern for electrically isolating the input transducers from the output ones on the piezoelectric substrate 20. The shielding electrode pattern 35 forms a slight angle relative to the direction normal to the propagation path of the elastic surface wave and is connected to the bus bar conductor of a reference potential, usually the ground potential and grounded at the terminals 21' and 22'.

A first filter composed of the input transducer 23 and the output transducers (24; 25) constitutes a comb filter for the first channel band or VHF low-band (VHF$_L$) including the 1st to 3rd program channels. In a similar manner, a second filter composed of the input transducer 26 and the output transducers (27; 28) forms the comb filter for the second channel band or VHF high-band (VHF$_H$) including 4th to 12th program channels, while a third filter composed of the input transducer 29 and the output transducers (30; 31) constitutes the comb filter for the third channel band or UHF low-band (UHF$_L$) including 13th to 37th program channels. Finally, a fourth filter composed of the input transducer 32 and the output transducers (33; 34) constitutes the comb filter for the fourth channel band or UHF high-band (UHF$_H$) including 38th to 62nd program channels. In the illustrated embodiment, the arrangement as well as dimensions of the interdigital electrodes (23A; 23B), (24A; 24B) and (25A; 25B) of the respective transducers 23, 24 and 25 are selected so as to respond to the low frequency band VHF$_L$ of 150 to 162 MHz. Further, the distance between the output transducers 24 and 25, i.e., the inter-center distance of these transducers is selected relative to the inter-center distance between the input transducer 23 and the output transducer 24 such that the reciprocal of absolute difference in the delay of propagation time of the electrical signals derived from the output transducers 24 and 25 corresponds to the bandwidth of 6 MHz between the program channels. The same applies to the arrangement of the other comb filters for the other program channel bands but with the bandwidth of 2 MHz instead of 6 MHz.

More specifically, each of the transducers 23, 24 and 25 has ten pairs of normal type interdigital electrodes (twenty electrodes in total) with each electrode having a width of 5.6 μm, an overlap length of 500 μm and an interelectrode pitch of 11.2 μm so that the responding center frequency f$_{01}$ of the VHF$_L$ filter is at 156 MHz. The inter-center distance b of the output transducers 24 and 25 as well as the distance a are selected to be equal to 581 μm and 1300 μm, respectively, so that the difference in the delay time of the electrical signals derived from the output transducers 24 and 25 amounts to 167 ns for the given sound velocity determined by the material of the piezoelectric substrate 20 which is lithium niobate whose sound velocity is about 3500 m/sec in the case of the illustrate embodiment. With such parallel connection of the output transducers 24 and 25 so as to produce a delay time difference of 167 ns, the frequency characteristic of the filter for the first channel band VHF$_L$ is comb characteristic in which peaks appear for every $\Delta f = 1/167$ ns = 6 MHz.

In the case of the filter for the second high channel band VHF$_H$ composed of the transducers 26, 27 and 28, each of the transducer has 5.5 pairs of normal type interdigital electrodes (eleven in total). Each of the interdigital electrode is 3.5 μm in width, 500 μm in overlap length and 6.9 μm in electrode pitch so that the responding center frequency f$_{02}$ of the VHF$_H$ filter is 252 MHz for the sound velocity determined by the substrate material. Further, the dimensions a and b are selected equal to 1300 μm and 1744 μm, respectively, so that difference in delay time of the signals derived from the output transducers 27 and 28 becomes equal to 500 ns. The comb filter thus constructed exhibits a comb frequency characteristic in which peaks appear for every 2 MHz.

In the case of the filter for the third channel band UHF$_L$ constituted by the transducers 29, 30 and 31, each of these transducers has four pairs of normal type interdigital electrodes (eight electrodes in total). Each of the electrodes is 1.5 μm wide, 200 μm in overlap length and 2.9 μm in electrode pitch so that the responding center frequency $f_{03}$ of this $UHF_L$ filter is equal to 602 MHz. Dimensions a and b are selected to be 1300 μm and 1744 μm, respectively, so that the difference in the delay time of the electrical signals derived from the output transducers 30 and 31 is equal to 500 ns. The $UHF_L$ filter thus obtained exhibits a comb frequency characteristic in which peak appears for every 2 MHz.

In the case of the filter for the fourth high channel band $UHF_H$ constituted by the transducers 32, 33 and 34, each of these transducers has five pairs of normal type interdigital electrodes (ten electrodes in total). Each of the electrodes is 1.2 μm wide, 200 μm in overlap length and 2.3 μm in pitch so that the responding center frequency $f_{04}$ of the $UHF_H$ filter is at 752 MHz. Dimensions a and b are selected equal to 1300 μm and 1744 μm, respectively, so that the difference in time delay of the electrical signals derived from the output transducers 33 and 34 amounts to 500 ns. This filter for the $UHF_H$ band exhibits also a comb frequency characteristic in which peak appears for every 2 MHz. The shielding electrode 35 is 200 μm wide, 4 mm long and 4000 Å thick.

The four comb filters for the different channel frequency bands described above are disposed on one and the same substrate and connected in parallel. Thus, there has been proposed a composite comb filter device which is responsive over a wide frequency range including VHF and UHF bands.

As will be appreciated from the above description, the individual comb filters each capable of responding to frequency in a relatively narrow different frequency band are combined so as to cover as a whole a very wide frequency band according to the teaching of the present invention, which thus allows the surface-acoustic-wave filter having a relatively narrow fractional band (width) to be used. Further, since the individual comb filter having a relatively narrow frequency band is constituted by the surface-acoustic-wave filter exhibiting inherently a high impedance for the frequencies offset from the resonance frequency, a comb filter device exhibiting a wide-band frequency characteristic can be attained by disposing a plurality of the individual filters for different channel bands on a single-chip substrate and connecting them in parallel by common conductors. On the contrary, in the case of the filter circuit constituted by individual LC filters connected in parallel, it is indispensable to provide a channel band switching means.

As can be seen from FIG. 9A, the output transducers (24; 25), (27; 28), (30; 31) and (33; 34) of the individual filters are located at one side of the associated input transducers 23, 26, 29 and 33 on the same chip substrate and arrayed linearly in accordance with the fundamental arrangement shown in FIG. 3.

FIG. 9B shows a modification of the arrangement of FIG. 9A in which input and output terminals are provided for each group of the VHF band filter and the UHF band filters to facilitate the couplings with the VHF tuner and the UHF tuner of the receiver. On the substrate 20, the input transducers 23 and 26 of the $VHF_L$ and $VHF_H$ filter are coupled in common and adapted to receive a VHF tuner output through input terminals 41 and 41', and the output transducers (24; 25) and (27; 28) are coupled in common to output terminals 42 and 42'. The input transducers 29 and 32 of the $UHF_L$ and $UHF_H$ filters are also coupled in common and adapted to receive a UHF tuner output through input terminals 43 and 43', and the output transducers (30; 31) and (33; 34) of the filters are coupled in common on the substrate to lead out the output of the filters through output terminals 44 and 44'.

FIG. 10 illustrates graphically the frequency characteristic of the comb filter shown in FIGS. 9A and 9B. In FIG. 10, the peaks 45 are partially illustrated by a dotted envelope curve. However, it will be readily understood that the peak-bottom profiles 45 are repeated along the frequency abscissa, as indicated by solid lines.

For the piezoelectric substrate material exhibiting the surface wave velocity on the order of 3500 m/sec, a single crystal of $LiTaO_3$ or quartz may also be used in place of $LiNbO_3$ described above. The required chip size of $LiTaO_3$ may be of 6×5 mm. In order to attain frequency accuracy of 100 KHz, the tolerance in the distance between the output transducers has to be within 0.2 μm. For example, in order to attain an accuracy of 100 KHz for the center frequency $f_0$ of 750 MHz, tolerance should be less than ±0.2 μm for the inter-center distance of 1700 μm between the output transducers. Such an accuracy requirement can be easily attained through the present day IC technology. Thus, a desired comb filter characteristic can be attained over a wide frequency band without resorting to adjustments.

FIG. 11 is a plan view to show the acoustic surface wave filter for the channel selection according to another embodiment of the present invention. In this embodiment, the comb filters for the $VHF_L$ and $VHF_H$ bands are provided to share a first common propagation path, while the filters for the $UHF_L$ and $UHF_H$ bands are provided to share a second common propagation path extending in parallel with the first propagation path. With this arrangement, the chip on which the transducers 23 to 34 are located can be reduced in area by 30 to 40% as compared with the chip shown in FIG. 9A or 9B, thereby increasing packaging density on a chip.

The individual transducers 23 to 34 of the filters shown in FIGS. 9A, 9B and 11 are each formed of normal type interdigital electrodes. However, when the interdigital electrodes of the input transducers 23, 26, 29 and 32 are weighted through a known weighted acoustic surface wave element technology, the envelope shown in FIG. 10 becomes flattened with difference in the individual peak values being decreased, whereby the comb filter characteristic is further improved. Such weighting technology is disclosed in a copending U.S. Application Ser. No. 946,193 filed Sept. 27, 1978 of Murata and Matsuura corresponding to Japanese Patent Application Nos. 52-122387 and 52-125736 filed on Oct. 14, 1977 and Oct. 21, 1977 and assigned to the same assignee as the present application.

Although the above description has been made of the assumption that the present invention is applied to the channel selection of television receivers adapted to the Japanese television broadcasting standard merely by way of exemplary illustration, it is self-explanatory that the present invention can be equally applied to other television receivers of different standards in other countries independently of NTSC and PAL systems. In the foregoing description, it has been also assumed that the comb characteristic in such that a peak appears for every 6 MHz for the VHF$_L$ band and for every 2 MHz for the other bands. It is possible that a plurality of peaks make appearance for each of the program channels included in the channel bands by appropriately selecting parameters of the transducer arrangements. For example, a peak may appear for every frequency such as 1 MHz or 3 MHz which is a divisor of the interchannel interval of 6 MHz to thereby obtain an automatic channel selection system. Similarly, this invention can be applied to program selection systems for FM radio receivers.

As appreciated from the foregoing description, the present invention has now provided a small-sized, single-chip, integrated, acoustic-surface-wave comb-filter which exhibits desired comb-characteristics over a wide frequency range and which can be manufactured inexpensively without requiring adjustment or trimming procedure. The present invention thus contributes to simplification of the structure of the automatic channel selecting tuner systems.

For preventing reflection of the acoustic surface wave, known terminations and means such as angled edge may be provided in the piezoelectric substrate. Further, various absorbers may be disposed at end portions of the substrate, if desired. It will be easily understood that the same filter effect will result also when the output transducers are supplied with input signals and the input transducers are used as output ones in the embodiments of FIGS. 9A, 9B and 11.

What is claimed is:

1. A surface-acoustic-wave filter for a channel selection tuning system comprising:
    a piezoelectric substrate;
    a plurality of surface-acoustic-wave comb filter means provided integrally on a surface of said substrate and exhibiting as a whole a comb frequency characteristic which corresponds to a channel frequency distribution for a plurality of channel bands corresponding to different programs over a wide channel range, each surface-acoustic-wave comb filter means comprising:
    an input transducer for converting a local oscillator output of a corresponding channel band into an acoustic surface wave;
    first and second output transducers electrically connected and physically spaced for converting surface acoustic waves from the input transducer into electric signals, said first and second output transducers being located along a surface-acoustic-wave propagation path on the substrate with different distances from and on the same side of said input transducer, the respective spacings of said first and second output transducers from said input transducer being such that the reciprocal of a differential delay time between the output electrical signals from said first and second output transducers is equal to a divisor of a channel spacing in the corresponding channel band;
        input and output terminal means coupled on the substrate for connecting at least two of said filter means in parallel, said output terminal means being directly coupled with said first and second output transducers to provide a sum of outputs of the first and second output transducers as the output of the comb filter.

2. A filter according to claim 1, in which said plurality of filter means are all connected in parallel on the substrate.

3. A filter according to claim 1, in which said plurality of filter means are juxtaposed on the surface of said substrate with respect to the surface-acoustic-wave propagation path.

4. A filter according to claim 1, in which at least two of said plurality of filter means are aligned along the same wave-propagation path in an offset relation to share a common propagation path for different acoustic surface waves from the respective input transducers and are electrically connected in parallel on said substrate.

5. A filter according to claim 1, in which said piezoelectric substrate is composed of a single chip of LiNbO$_3$, LiTaO$_3$ or quartz.

6. A filter according to claim 1, in which said input and output terminal means include bus bar conductors formed integrally with said transducers on the substrate.

7. A filter according to claim 1, which comprises a bar conductor for signal isolation on the substrate between said input transducers and said output transducers nearer thereto to transverse the wave-propagation path, said bar conductor being connected to a reference potential.

8. In a channel selection system for a television receiver, a comb filter device for program channel detection comprising
    a surface-acoustic-wave composite filter formed in a piezoelectric substrate,
    said composite surface-acoustic-wave filter comprising:
        common input means for receiving a local oscillation signal from a tuner;
        a plurality of spaced input transducers which are electrically coupled together to said input means and responsive to an applied local oscillation signal corresponding to program channel components for generating surface acoustic waves respectively along isolated and parallel wave-propagation paths on said piezoelectric substrate, the respective input transducers having maximum response in respective channel bands of a predetermined number into which different program channels are correspondingly grouped in sequence of channel frequency magnitude;
        a plurality of pairs of output transducers, each pair of output transducers being located in a corresponding wave-propagation path relative to the corresponding one of said input transducers on one side thereof for developing output signals in response to the generated surface acoustic wave from said corresponding input transducer,
        said output transducer pair, individually including first and second output transducers electrically connected with each other and physically spaced from said corresponding input transducer with different distances such that the reciprocal of the difference between delay times of output signals from the first and second output transducers is equal to a divisor of a channel spacing in a corresponding channel band; and
        common output means coupled in common to said plurality of pairs of output transducers for deriving an output of the composite filter.

9. The filter device according to claim 8, in which said input and output means include bus bars, and said transducers include a plurality of interdigital electrodes, the interdigital electrodes of the transducers for each channel band geometrically determining maximum frequency response for the channel band, said bus bars and interdigital electrodes on the side of each of the input transducers and the output transducers being integrally formed on the same surface of the piezoelectric substrate.

10. The filter according to claim 8, in which said transducers of said plurality of input transducers are located in juxtaposed relationship on the substrate surface.

11. A one-chip acoustic surface-wave, wide-band responsive, comb filter formed in a piezoelectric substrate for use in a VHF/UHF television channel selection system comprising:

first and second acoustic surface wave filter means responsive to local oscillator frequencies corresponding to a low band and a high band of a VHF program band, respectively, third and fourth acoustic surface-wave filter means responsive to local oscillator frequencies corresponding to a low band and a high band of a UHF program band, respectively, each filter means comprising an input transducer having maximum response in a corresponding allotted channel band for converting a local oscillator output into an acoustic surface wave, and a pair of output transducers whose outputs are additively coupled to develop an output signal of the filter means and located only on one side of said input transducer along a wave-propagation path on the substrate surface to establish a desired comb filter characteristic, the respective spacings of the pair output transducers from the input transducers being different such that the reciprocal of a differential delay time between electrical signals from the pair output transducers is equal to a divisor of a channel spacing in the corresponding channel band, said first and second filter means being connected in parallel and adapted to receive a local oscillator signal of a VHF tuner, and said third and fourth filter means being connected in parallel and adapted to receive a local oscillator signal of a UHF tuner.

12. A surface-acoustic-wave filter for a channel selection system of an electronic receiver comprising:

a piezoelectric substrate;

a plurality of surface-acoustic-wave comb filter means formed integrally on one face of said substrate, and having different center frequencies with respect to allotted filter bandwidth to cover a VHF/UHF local oscillator frequency range to thereby exhibit a wide-band comb filter characteristic as a whole, each comb filter means comprising:

first, second and third electroacoustic transducers for converting electrical signals into surface-acoustic-waves or vice versa, said first and second transducers being electrically directly coupled and physically spaced, and aligned along a surface-acoustic-wave propagation path on the substrate on one side of said third transducer with different distances therefrom, the respective spacings of said first and second transducers from said third transducer being such that the reciprocal of a differential delay time between output signals of the filter means due to the spacing between the first and second transducers is equal to a divisor of a channel spacing in a corresponding channel band, one of said directly-coupled first and second transducers and said third transducer being supplied with a local oscillator output, while the other providing an output of the filter; and input and output terminal means formed on the substrate for coupling at least two of said comb filter means in parallel connection.

* * * * *